United States Patent [19]
Yamazaki et al.

[11] Patent Number: 5,371,371
[45] Date of Patent: Dec. 6, 1994

[54] MAGNETIC IMMERSION FIELD EMISSION ELECTRON GUN SYSTEMS CAPABLE OF REDUCING ABERRATION OF ELECTROSTATIC LENS

[75] Inventors: Yuichiro Yamazaki, Edogawa; Motosuke Miyoshi, Minato; Takamitsu Nagai, Shinjuku, all of Japan

[73] Assignee: Kabushiki Kaisha Toshiba, Kawasaki, Japan

[21] Appl. No.: 112,802

[22] Filed: Aug. 27, 1993

[30] Foreign Application Priority Data

Aug. 27, 1992 [JP] Japan .................. 4-228685

[51] Int. Cl.⁵ .................. H01J 37/10; H01J 37/145; H01J 37/15
[52] U.S. Cl. .................. 250/396 R; 250/396 ML
[58] Field of Search .................. 250/396 R, 396 ML

[56] References Cited

U.S. PATENT DOCUMENTS

| | | | |
|---|---|---|---|
| 2,714,678 | 8/1955 | Wolff | 250/396 ML |
| 3,818,394 | 6/1974 | Katagiri et al. | 250/396 ML |
| 4,675,524 | 6/1987 | Frosien et al. | 250/310 |
| 4,926,054 | 5/1990 | Frosien | 250/396 R |
| 5,079,428 | 1/1992 | Da Lim | 250/396 ML |
| 5,146,090 | 9/1992 | Plies | 250/396 ML |

FOREIGN PATENT DOCUMENTS

| | | |
|---|---|---|
| 0462554 | 12/1991 | European Pat. Off. |
| 2-37651 | 2/1990 | Japan |

OTHER PUBLICATIONS

"Field emission electron gun systems incorporating single-pole magnetic lenses", J. R. A. Cleaver, Optik 52(1978/79) No. 4, pp. 293-303.

"Development of the field emission electron gun integrated in the sputter ion pump", Yamazaki et al., Journal of Vacuum Science and Technology; Part B, vol. 9, Nov. 1991, pp. 2967-2971.

"A new design of field emission electron gun with a magnetic lens", Delong et al., Optik, vol. 81, 1989, pp. 103-108.

"The characteristics of a magnetic-field-immersed pulse field emission gun", Katsuta et al., Proc. XIth Int. Cong. on Electron Microscopy, Kyoto, 1986, pp. 267-268.

Patent Abstracts of Japan, vol. 14, No. 493, Oct. 26, 1990 (JP-A-02 204 946) p. 1/1.

*Primary Examiner*—Bruce C. Anderson
*Attorney, Agent, or Firm*—Foley & Lardner

[57] ABSTRACT

A magnetic immersion field emission electron gun has a vacuum vessel having a central axis in a predetermined direction, a cathode arranged along the central axis of the vacuum vessel for generating an electron beam, an anode for forming an electron beam path by accelerating a generated electron beam in the central axis direction, an electrostatic lens arranged between the cathode and anode for generating an electric field which focuses an accelerated electron beam toward the central axis, a magnetic field generating element arranged around the electron beam path for generating a magnetic field for focusing the electron beam in order to preventing a diameter of the electron beam from expansion by an aberration of the electrostatic lens, and a moving mechanism for moving the magnetic field generating element at a position where a peak point of a strength of the magnetic field generated by the magnetic field generating element coincides with a portion where the aberration of the electrostatic lens becomes most conspicuous. The electron gun having such a configuration can provide an effect of reducing a spherical and chromatic aberration by efficiently providing a lens characteristic to the electrostatic lens even though the entire length of electrostatic lens is long.

14 Claims, 11 Drawing Sheets

:::page-number
1
:::

MAGNETIC IMMERSION FIELD EMISSION ELECTRON GUN SYSTEMS CAPABLE OF REDUCING ABERRATION OF ELECTROSTATIC LENS

BACKGROUND OF THE INVENTION

The present invention relates to an improvement of a field emission electron gun systems which are used in electron beam applied apparatus such as a scanning electron microscope (SEM), an electron beam exposure device, a size measuring scanning electron microscope, and the like, using an electron beam, and more particularly relates to an improvement of a magnetic immersion field emission electron gun which is used in the electron beam applied apparatus and capable of reducing an aberration of an electrostatic lens by focusing an electron beam by means of a superposition of a magnetic field over an electrostatic lens system.

In the electron beam applied apparatus, an electron gun assumes an important part for generating electron beam. Recently, there becomes to be used an electric field emission type electron gun which has the high luminance in comparison with a conventional hot cathode. A tip of a cathode in the electric field emission type electron gun is formed in an extremely small needle shape (a radius on or less than 1 $\mu$m), and an electron is radially emitted from the cathode. Since a large opening angle of the beam needs to obtain a large current, a beam diameter is caused to be extended because of a spherical aberration of an electrostatic lens system provided in the electron gun, thereby reducing a luminance. Accordingly, a magnetic field superposes over the electrostatic lens system including the cathode to focus the electron beam to thus decrease an aberration of the electrostatic lens. An electron gun having such a construction is called as a magnetic immersion field emission electron gun system.

Figure 1:
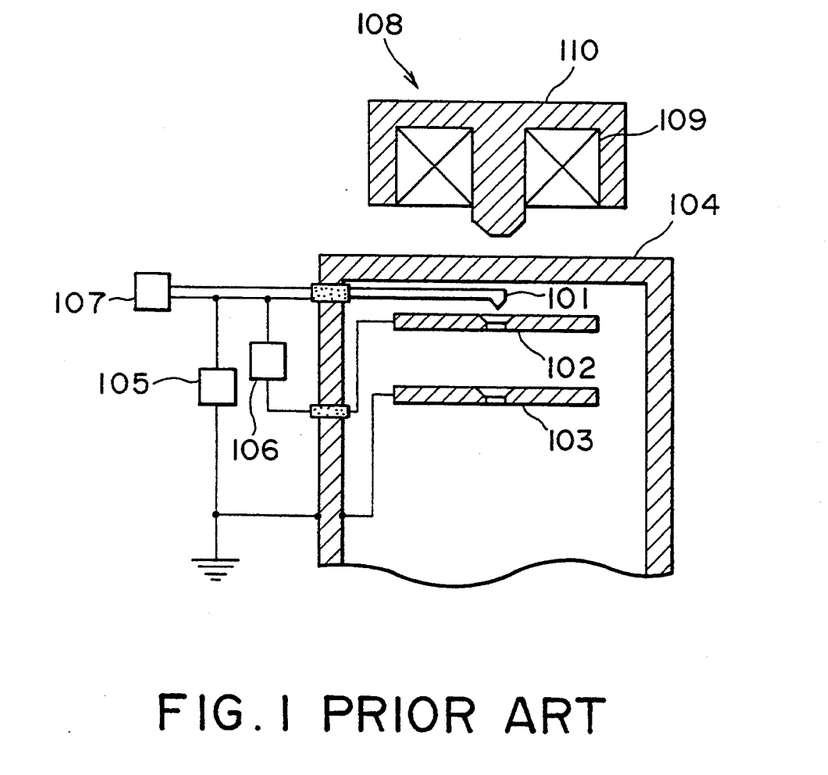
FIG. 1 is a sectional view showing a schematic configuration of a convectional magnetic immersion field emission electron gun.

FIG. 1 is a section view showing an example of a conventional magnetic immersion field emission electron gun. The electron gun is a three-electrode field emission type electron gun which comprises a cathode 101, a first anode 102, and a second anode 103. The second anode 103 is connected with a vacuum vessel 104 to be grounded. A power source 105 supplies to the cathode 101 with an acceleration voltage which is negative to the vacuum vessel 104. Furthermore, the cathode 101 is heated by a power source 107. The first anode 102 is connected to a power source 106 to be positive voltage to the cathode 101.

A single-pole magnetic field lens 108 is provided outside the vacuum vessel 104 to superpose a magnetic field over the electron gun. The single-pole magnetic field lens 108 comprises a coil 109 for generating a magnetic flux, and a magnetic substance 110 for forming a magnetic path.

The electrostatic lens system of the conventionally used magnetic immersion field emission electron gun is a two-polar electron gun comprising a cathode and an anode, or a three-polar electron gun comprising a cathode, a first anode and a second anode. Since these electron guns configured above have a little number of polar and short length of the entire electron gun (a distance from the cathode to the anode), the magnetic superposition near the cathode contributes to a reduction of a spherical aberration.

On the other hand, since the necessity happens to independently set an emission current and cross-over position (a focal point) in the electron beam applied apparatus, the necessity starts the use of the electron gun which independently has a leader electrode and a lens electrode, wherein the leader electrode determines an emission current and the lens electrode determines the cross-over position. However, when the electron gun is comprised of a four-polar construction having a cathode, a leader electrode, a lens electrode, and an anode, it is impossible for the conventional magnetic immersion field emission electron gun superposing the magnetic field near the cathode to sufficiently reduce the spherical aberration. Because aberration occurring positions do not concentrate near the cathode on the basis that there are large numbers of the electrodes in a multi-electrode construction over four electrodes and the electron gun has the long length. Furthermore, in order to obtain the high magnetic strength along the entire electrostatic lens system, there becomes large size of a electromagnet or permanent magnet for generating a magnetic field, thereby lacking usefulness.

For example, in "an electron beam gun" disclosed in the official gazette of Japanese patent laid-open number Heisei 2-37651(1990), which comprises a cathode and three-polar portion of a first to third polar, there is provided a permanent magnet generating a magnetic field for reducing a diameter of an electron beam, which is arranged near a passing hole of the electron beam of the second electrode and within a thickness range of the axial direction of the second electrode. As has been immediately understood from viewing FIG. 1 disclosed in this official gazette, the permanent magnet is arranged in a groove of the second electrode which is formed in U-shape in section, and the magnetic field generated by the permanent magnet makes a flux size of the electron beam be slender for improving a spherical aberration of a main lens.

SUMMARY OF THE INVENTION

Accordingly, an object of the present invention is to provide a magnetic immersion field emission electron gun for superposing a magnetic field in the manner that the superposition of the magnetic field of eliminating a level difference between the image data makes an aberration of an electrostatic lens system included in the magnetic immersion field emission electron gun.

In order to achieve the above object, a magnetic immersion field emission electron gun according to the present invention comprises a vacuum vessel having a cylindrical body, a cathode arranged along the center axis of the vacuum vessel for generating an electron beam, an anode for forming an electron beam path by accelerating the generated electron beam along the direction of the central axis, an electrostatic lens arranged between the cathode and the anode for generating an electric field which focuses the accelerated electron beam into the central axis, magnetic field generating means arranged around the electron beam path for focusing the electron beam in order to reduce an aberration of the electrostatic lens, moving means for moving the magnetic field generating means at the position where a peak value of the magnetic field strength coincides with an aberration conspicuity portion of the electrostatic lens.

In the above construction, the magnetic field is superposed to the portion where an aberration of the electrostatic lens occurs in the field emission type electron gun, and the magnetic field focuses the electron beam to compensate the electrostatic lens system, thereby reducing the aberration of the electron beam in the electrostatic gun having a long shape. At the same time, since the magnetic field generating means is moved to the position where the a peak of the magnetic field strength coincides with the most conspicuous portion of the aberration of the electrostatic lens, it is possible to suitably compensate the aberration occurring in the electrostatic lens system.

In the electron gun according to the present invention, even though there is a field emission type electron gun having a long entire length of the electrostatic lens system such as the four-polar construction, since the partially strong magnetic field can be superposed to the aberration occurring portion in the electrostatic lens system, it is possible to efficiently suppress a lens influence of the electrostatic lens system, thereby providing a multi-polar electrode electron gun having a low spherical aberration.

Furthermore, since it is possible to change a relative position between the magnetic field distribution on the lens axis and the electrostatic lens system, the maximum position of the magnetic field is set to the position at an occurrence of the aberration corresponding to the supply voltage of each electrode to suppress the aberration into the minimum value, so that it is possible to make the electrode gun be the most suitable condition.

Still furthermore, since a magnetic path is formed by a magnetic substance connecting peripherals of a plurality of magnets having an axisymetrically ring shape, it is possible to suppress a leakage of the magnetic field outside the magnetic substance and to increase a strength of the magnetic field distribution on the axis. As the result, it is possible to efficiently superpose the magnetic field to the electrostatic lens system.

Moreover, since the magnetic field distribution can be changed by using a composite magnetic field of the electromagnet and the permanent magnet, it is possible to simply set the maximum value of the magnetic field to an arbitrary position where the aberration occurs.

Furthermore, it is possible for the use of automatic position detection and control means to easily and automatically coincide the relative position between the peak point of the magnetic strength and the lens aberration conspicuous portion.

DETAILED DESCRIPTION OF THE PREFERRED EMBODIMENT

There will now be described preferred embodiments of a magnetic immersion field emission electron gun according to the present invention in accordance with the attached drawings.

Figure 2:
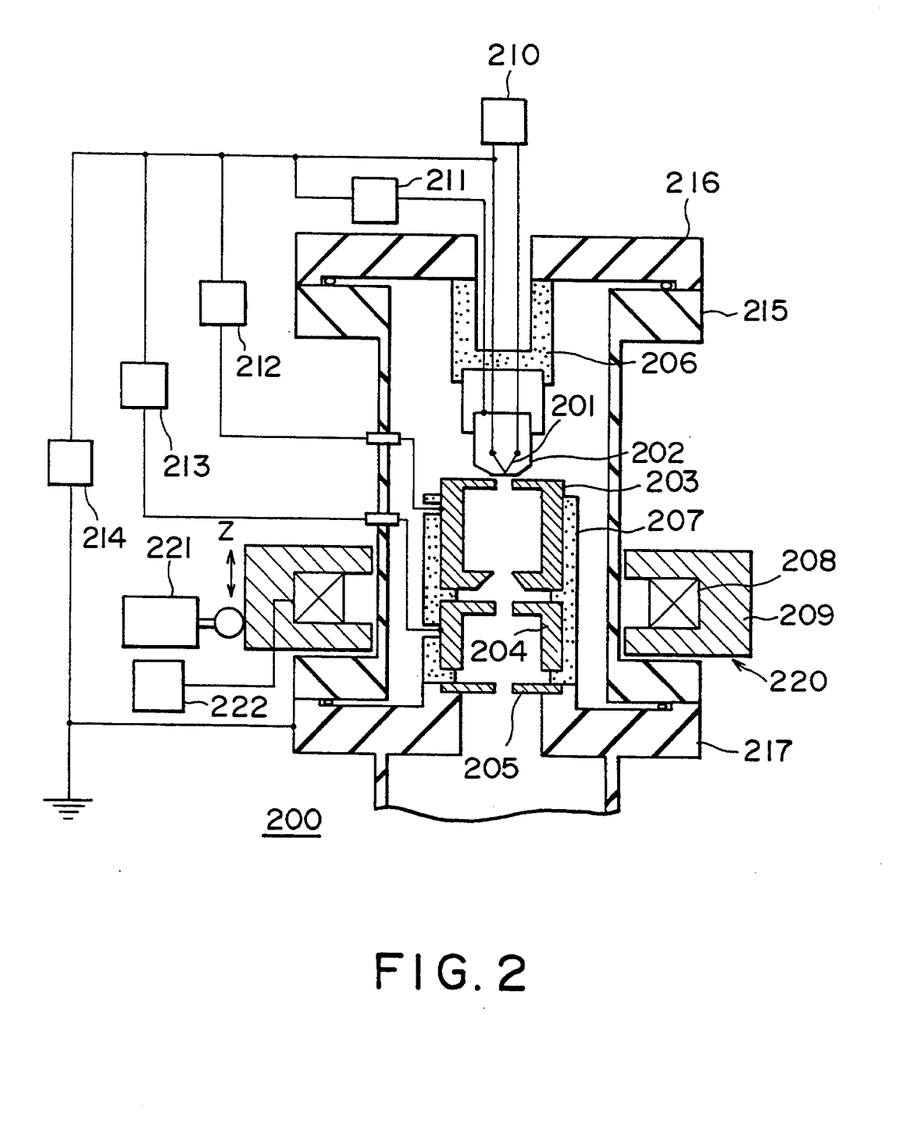
FIG. 2 is a sectional view showing a schematic configuration of a magnetic immersion field emission electron gun according to a first embodiment of the present invention.

FIG. 2 is a sectional view showing a configuration of a first embodiment. In the figure, a magnetic immersion field emission electron gun 200 comprises a cathode 201, a suppressor electrode 202, a leader electrode 203, a lens electrode 204, and an anode 205. The cathode 201, which is formed by an emitter comprised of zirconium oxide/tungsten (ZrO/W), becomes heated by a current supplied from a power source 210 to operate in a thermoelectric field emission mode. The suppressor electrode 202 is provided in the manner of covering the entire cathode 201 in order to suppress an electron emission in the unnecessary direction from the cathode 201. A power source 211 supplies a negative voltage to the cathode 201 in the manner that the voltage of the suppressor electrode 202 becomes to be $-250$ to $-350$ [IV]. A power source 214 supplies a cathode-anode acceleration voltage to the cathode 201 installed in the suppressor electrode 202 for accelerating in the direction of the anode 205 the electron beam which is emitted from an opening of the suppressor electrode 202 to the central axis of the electron gun. The suppressor electrode 202 is fixed on an insulator 208 formed by ceramic material, and the insulator 208 is mounted to a vacuum flange 216 which is arranged on the upper end portion of an upper vacuum vessel 215 having a cylindrical shape. A metal O-ring as a vacuum seal is provided between the upper vacuum vessel 215 and the vacuum flange 216 for keeping a vacuum condition in the vessel 215.

The leader electrode 203 having a cylindrical shape is arranged near the cathode 201 and in the manner of owning in common the central line of the cathode 201. The leader electrode 203 positions 0.5 mm from the cathode 201 and is supplied a positive voltage of 4000–5000 [V] from a power source 212. The lens electrode 204 having a cylindrical shape is arranged at the position adjacent to the leader electrode 203 in order to determine a focal point (a cross-over position) of the electron beam. A variable power source 213 supplies to the lens electrode 204 a voltage corresponding to a set value. The anode 205 is arranged to the position adjacent to the lens electrode 204, and fixed to a lower vacuum vessel 217 having a cylindrical shape and grounded. The leader electrode 203, the lens electrode 204 and the anode 205 are fixed in the manner of coinciding with central lines each other by an insulation part 207 which is formed in a cylindrical shape by a ceramic material thereby keeping an electrical insulation and a mechanical accuracy of each of the electrodes. The insulation part 207 is fixed to the upper end portion of the lower vacuum vessel 217.

The metal O-ring as a vacuum seal is provided between the lower end portion of the upper vacuum vessel 215 and the upper end portion of the lower vacuum vessel 217 in order to keep the vacuum condition in the vacuum vessels 215 and 217. The three-polar construction of the electrostatic lens system is formed by the cathode 201, the suppressor electrode 202, the leader electrode 203, the lens electrode 204 and the anode 205. The electro-static lens system is specifically configured from asymmetrical lens system in which the lens electrode 204 is inclined toward the side of the leader electrode 203.

A ring shaped electromagnet 220 comprising an electromagnet coil 208 and a magnetic substrate 209 is provided around an electron beam path which is formed through the suppressor electrode 202, the leader electrode 203, the lens electrode 204 and the anode 205 outside the upper vacuum vessel 215. A variable power source 222 supplies a driving current to the electromagnet coil 208.

A magnetic path formed by the magnetic substance 209 suppresses a divergence of a magnetic flux which is generated by the electromagnet coil 208. A shape of the magnetic path is designed in order to increase the magnetic field strength on the central axis of the electrode and to partially strengthen the magnetic field. The position of the electromagnet 220 can be moved in the direction Z of the central axis of the upper vacuum vessel 215 to set the position where a portion of the maximum value of the magnetic field coincides with a portion of the aberration of the electrostatic lens system. The portion of the occurrence of the aberration of the electrostatic lens system changes according to an acceleration voltage and a voltage of the leader electrode. Therefore, there is provided a moving mechanism 221 which causes the electromagnet 220 to be moved along the central axis direction Z of the electron gun 200 in order to freely set the relative position of the electromagnet 220 against the electron gun 200. The moving mechanism 221 comprises a motor, a gear, and a screw mechanism.

There is described now a portion where the aberration occurs in the electrostatic lens system. The following equations give aberration coefficients of the electrostatic lens by using a paraxial track.

$$C_{SO} = \frac{1}{16\sqrt{V(Z_0)}} \int_{Z_0}^{Z_i} \left\{ \left| \frac{5}{4} \left(\frac{V'}{V}\right)^2 + \frac{5}{24} \left(\frac{V''}{V}\right)^4 \right| r_a^4 + \frac{14}{3} \left(\frac{V'}{V}\right)^3 r'_a r_a^3 - \frac{3}{2} \left(\frac{V'}{V}\right)^2 r'^2_a r_a^2 \right\} \sqrt{V} \, dz$$

$$C_{CO} = \sqrt{V(Z_0)} \int_{Z_0}^{Z_i} \left( \frac{1}{2} \frac{V'}{V} r'_a + \frac{1}{4} \frac{V''}{V} r_a \right) \frac{r_a}{\sqrt{V}} \, dz$$

Here, $C_{SO}$ and $C_{CO}$ respectively denote a spherical aberration and a chromatic aberration at the object side, $Z_o$ and $Z_i$ respectively denote positions at the object side and the image side, $r_a$ denotes a paraxial track, $V$, $V'$ and $V''$ respectively denote a potential distribution, a single-step differential and two-step differential of the potential distribution, and $V(Z_o)$ denotes a potential at the object side. It is possible to identify the positions where the aberration occur on the axis of the lens from the distribution of an integrand of the integral equation.

Figure 3A:
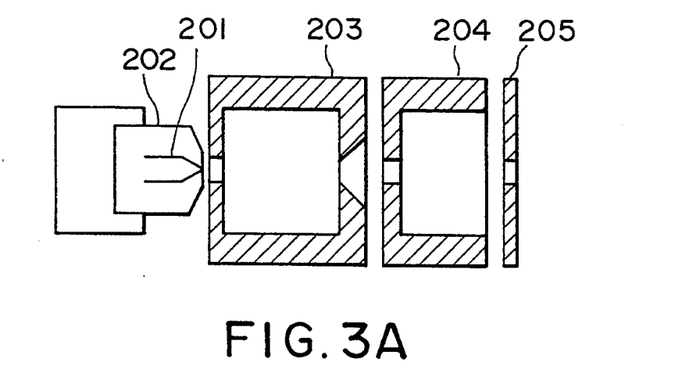
FIGS. 3A, 3B and 3C are a partially sectional view of an electrostatic lens system, a graph of an integrand distribution of a spherical aberration integral of the electrostatic lens system, and a graph of an integrand distribution of a chromatic aberration integral of the electrostatic lens system, respectively, with respective to the magnetic immersion field emission electron gun according to the first embodiment shown in FIG. 1.
Figure 3B:
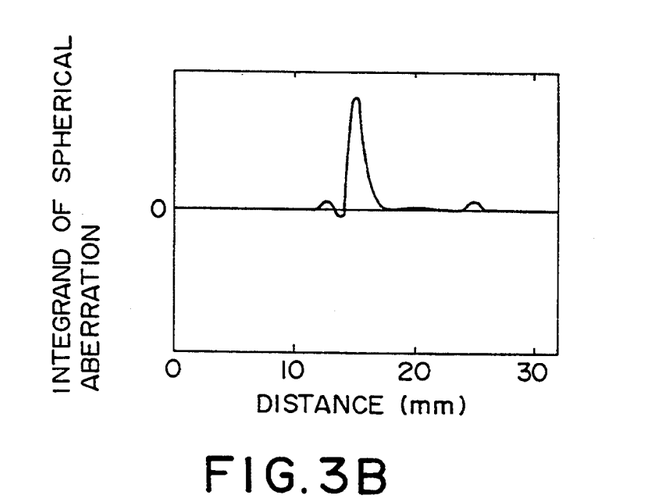
Figure 3C:
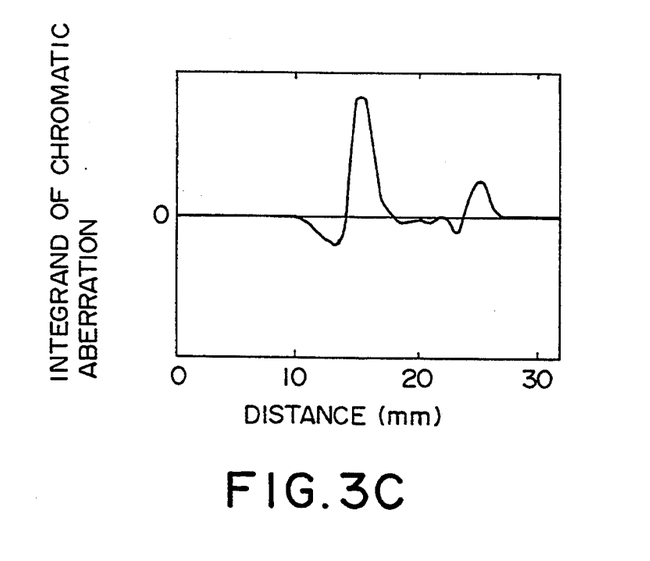

FIGS. 3A–3C show an example that an aberration of the electrostatic lens is obtained by using such a method, in which FIG. 3A shows a construction of the electrostatic lens system, FIG. 3B shows a distribution of a spherical aberration integrand corresponding to the construction shown in FIG. 3A when voltages of the cathode, leader electrode, lens electrode and anode are −1 [kV], 4 [Kv], 1.3 [Kv] and 0 [V], respectively, and a distance to the cathode position is 0, and FIG. 3C shows a distribution of a chromatic aberration integrand corresponding to the construction shown in FIG. 3A under the condition same as FIG. 3B.

The integrand distribution under the above condition is that both spherical and chromatic aberration have a peak between the leader and lens electrodes at the point of "Z=15" [mm]. The peak determines an aberration coefficient. By this, it would be understood that the aberration partially occurs between the leader electrode 203 and the lens electrode 204 because a potential sharply changes between the leader electrode 203 and the lens electrode 204 so as to increase the voltages V' and V'', thereby resulting an increase of the integrand. The changes of the potential distribution are largely influenced by the conditions of the cathode voltage, leader voltage, lens electrode voltage and anode voltage, thereby resulting the large change of the integrand distribution. Therefore, the aberration occurring positions are different from one another along the entire electrostatic lens system corresponding to the voltage conditions of each of electrodes. Accordingly, a magnetic field is supplied for compensating the aberration by the electromagnet 220 which is arranged around the electron beam path.

The magnetic pole construction of the first embodiment shown in FIG. 2 can efficiently suppress lens features of the electrostatic lens and the aberration of the lens by superposing the magnetic field partially increasing field strength over the aberration occurring portion of the electrostatic lens system even though there is a four-polar construction electrostatic lens system having an entire length being long in the field emission type electron gun. Furthermore, it is possible to change the relative position between an axial distribution of the magnetic field and the electrostatic lens system, thereby enabling an optimization of the electron gun in the manner that the aberration become minimum by means of the regulation of the peak value by the variable current source 222 to set the peak portion as maximum value of the magnetic field distribution to the position where the aberration occurs in respect to the supply voltage of each of the electrodes.

Even though the first embodiment uses the coil 208 for electromagnet as a source of the magnetic field, the source may be utilized by a ring-shaped permanent magnet having an axial symmetry. The permanent magnet is made of rare earth magnetic materials such as a samarium cobalt (SmCo) having 10 Kgs (kilo gauss) of a residual magnetic flux density. When a magnetic circuit is formed by the permanent magnet, it is possible to simplify a device because it is unnecessary to provide a constant current source and the like for the electromagnet. Furthermore, it is possible to bake the vacuum chamber 215 with the magnetic circuit attached. Still furthermore, it is possible to mount, in a vacuum space of the vacuum chamber 215, the magnetic circuit having the permanent magnet and the magnetic substance because gases are not emitted in the vacuum space, thereby achieving the miniaturization of the entire electron gun.

Furthermore, even though there is described the field emission type electron gun having the electrostatic lens system of the four-polar construction as an electron gun, the present invention may be applied to electron guns each having an electrostatic lens system of the multi-polar construction such as two-polar, three-polar and more than five-polar constructions. The first embodiment is described as to asymmetry construction electrostatic lens system, the present invention may be naturally applied to a symmetry construction electrostatic lens system.

Figure 4:
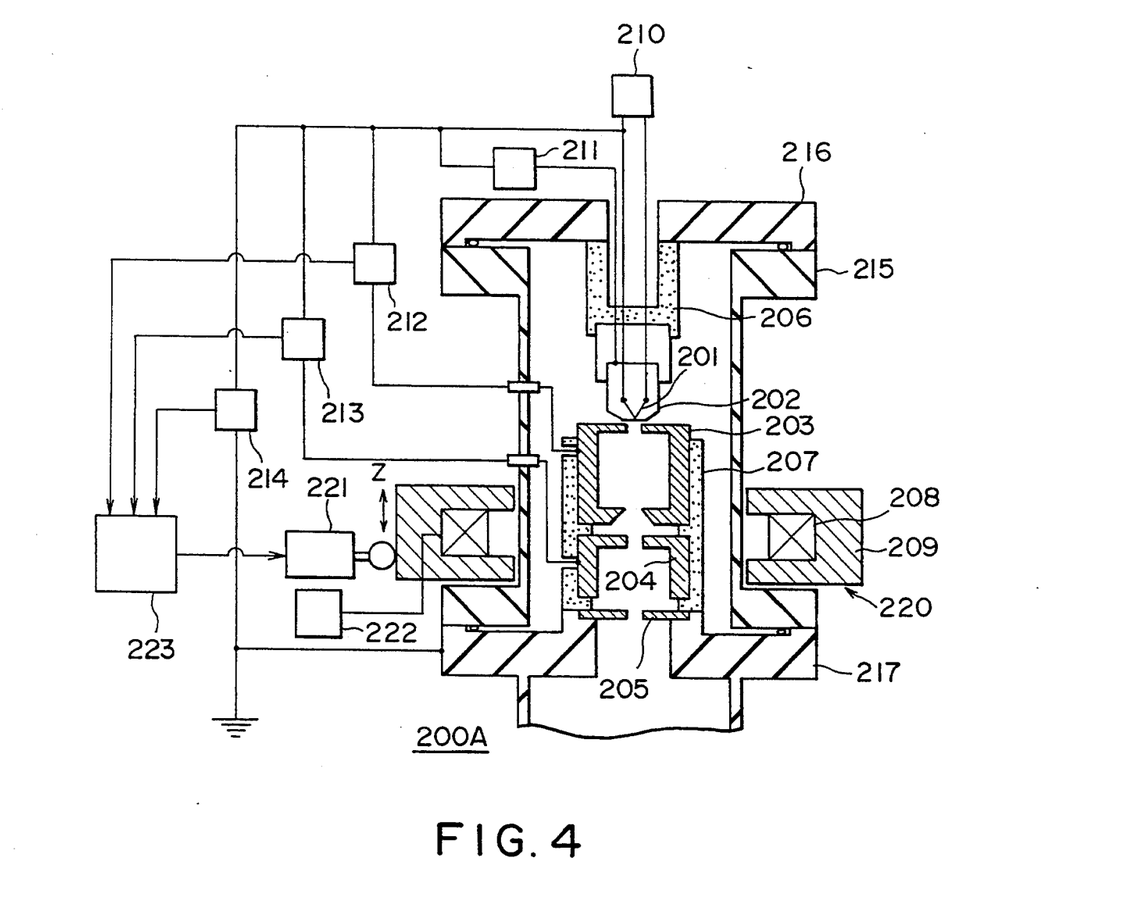
FIG. 4 is a sectional view showing a schematic configuration of a magnetic immersion field emission electron gun according to a second embodiment of the present invention.

Next, there will be described a magnetic immersion field emission electron gun 200A according to a second embodiment as a modified example of the first embodiment with reference to FIG. 4. The electron gun 200A according to the second embodiment has characteristics in that the gun 200A comprises an automatic position detection control mechanism 223 for automatically driving the moving mechanism 221 which regulates the electromagnet 220 moving along the Z-direction. The automatic position detection control means 223 receives set values of power sources 212, 213 and 214, respectively, in which the source 212 is provided for the leader electrode 203, 213 for the lens electrode 204 and 214 for supplying the acceleration voltage between the cathode and anode, and the means 223 calculates the portion where the aberration of the electrostatic lens system between the leader electrode 203 and the lens electrode 204 in the electron gun becomes the maximum value.

There will be described an operation of the magnetic immersion field emission electron gun 200A according to the second embodiment. The automatic position detection control mechanism 223 calculates the portion where the aberration of the electrostatic lens becomes largest in the manner described above, and directs a moving amount of the electromagnet 220 to the moving mechanism 221 on the basis of the calculated value. The moving mechanism 221 controls the rotation of such as motor and the like on the basis of a control signal outputted from the automatic position detection control mechanism 223, and causes the electromagnet to the optimum position in the Z-direction.

As described above, the electromagnet 220 is moved to the position where the peak point of the magnetic field strength coincides with the most conspicuous portion of the aberration of the electrostatic lens system. The movement of the electromagnet 220 causes the peak point of the field strength to coincide with the most conspicuous portion of the aberration to thus compensate the aberration of the electrostatic lens system.

Figure 5:
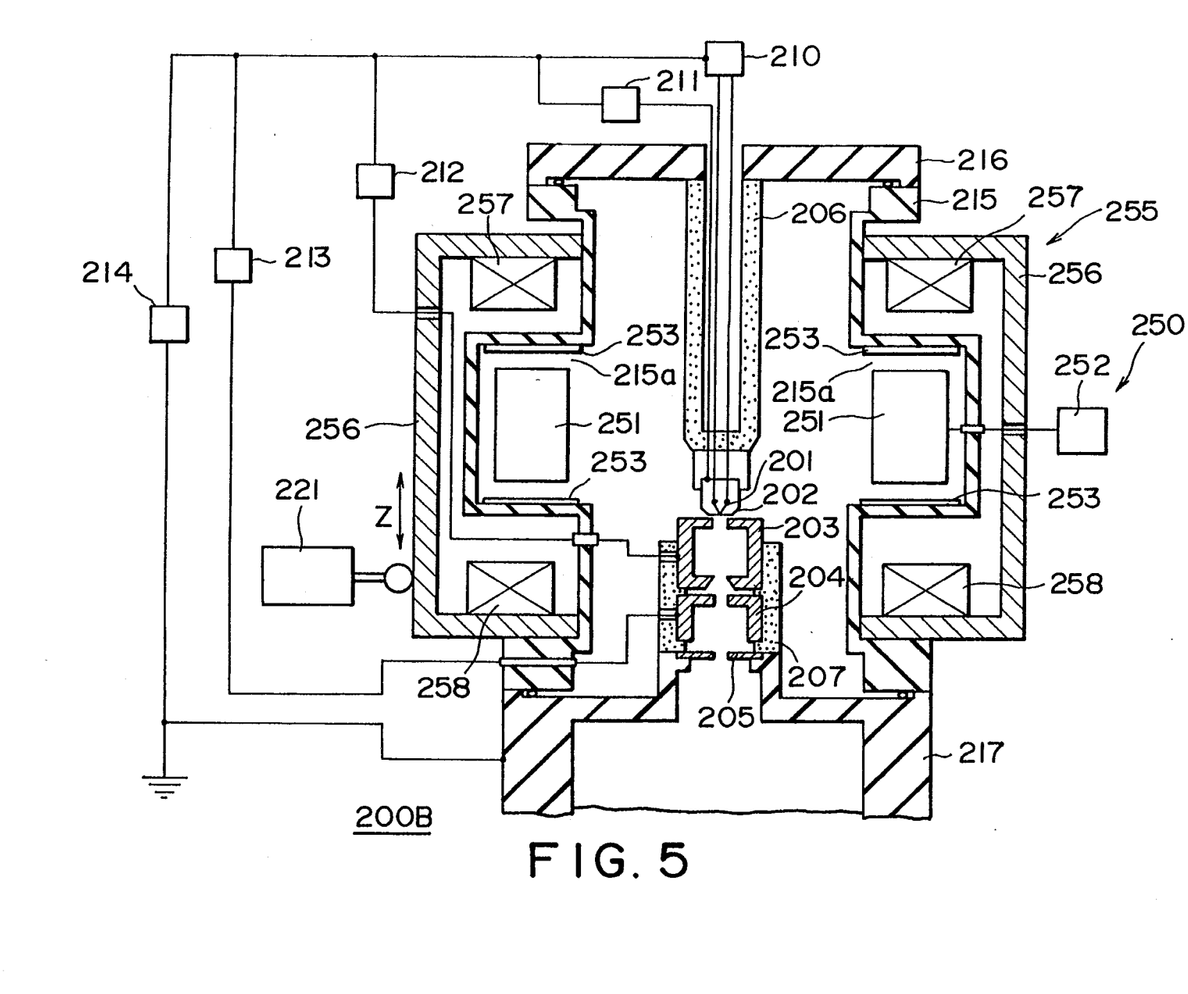
FIG. 5 is a sectional view showing a schematic configuration of a magnetic immersion field emission electron gun according to a third embodiment of the present invention.
Figure 6A:
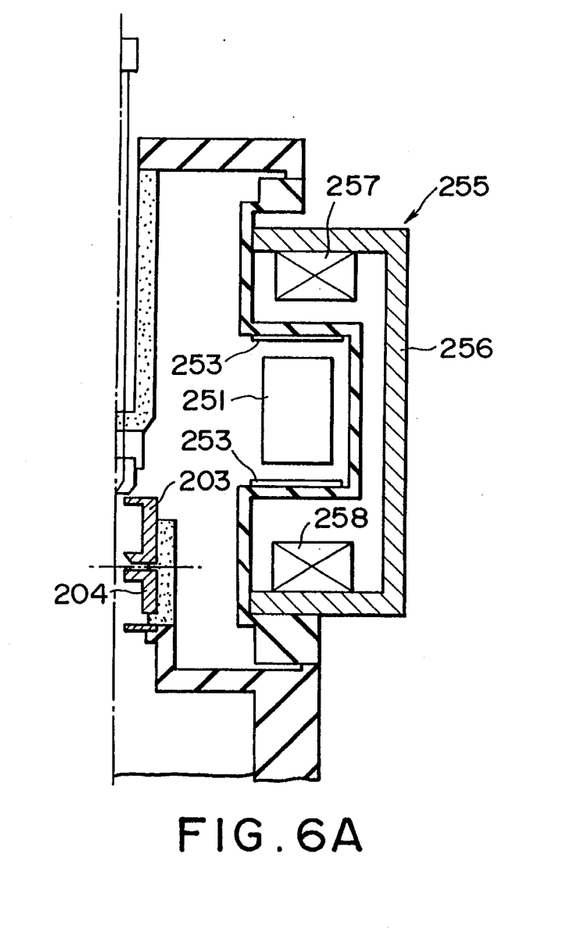
FIGS. 6A and 6B are a partially sectional view of the electrostatic lens, and a graph of the magnetic field distribution on the central axis of the electrostatic lens system, respectively, with respect to the electron gun according to the third embodiment shown in FIG. 5.
Figure 6B:
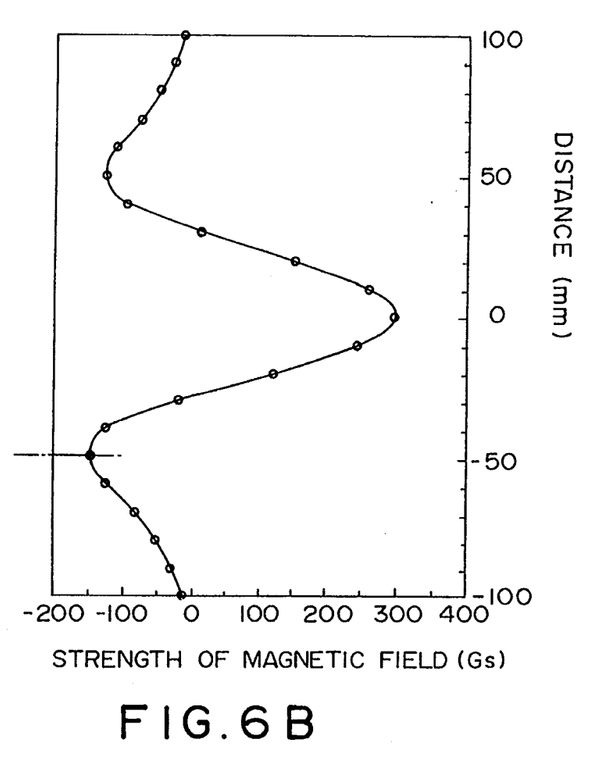
Figure 7:
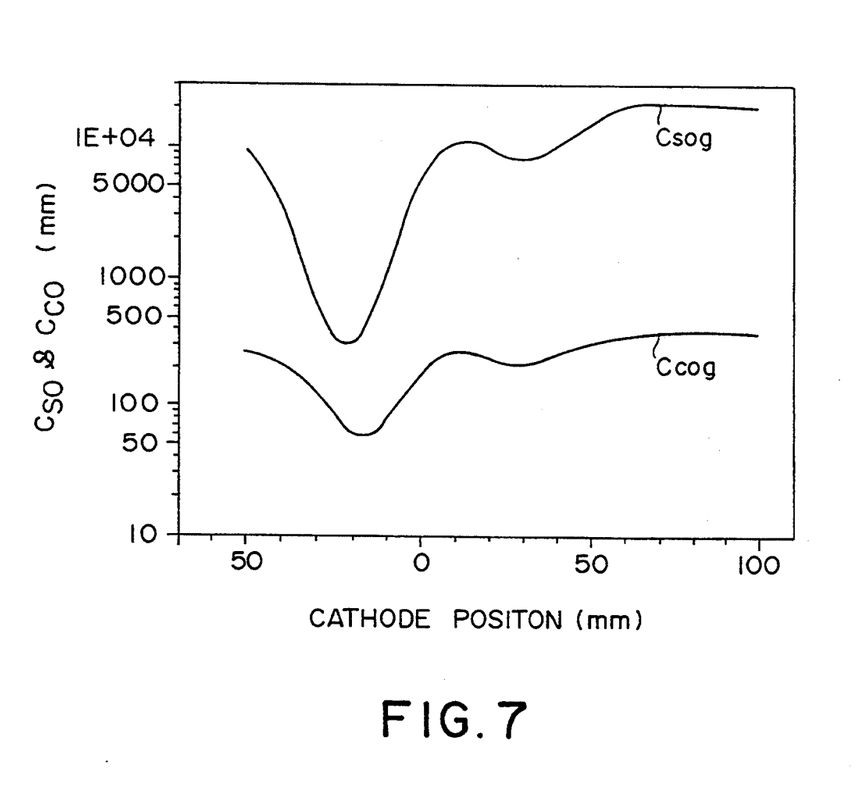
FIG. 7 is a graph showing a distribution of the aberration coefficient of the electrostatic lens system in the electron gun according to the third embodiment shown in FIG. 5.

Next, there is described a magnetic immersion field emission electron gun 200B according to a third embodiment of the present invention with respect to FIGS. 5-7 The electron gun 200B comprises a so-called ion pump 250 as exhaust means for maintaining a vacuum condition in the vacuum vessel. The ion pump 250 comprises an ion pump anode 251 which is mounted in a flange portion 215a having a rectangular section and formed in the manner that the intermediate portion of the vacuum vessel 215 is outwardly projected, an anode supply power source 252 for supplying a voltage impressed to the anode 251, and a ring-shaped plate electrodes 253. formed by titanium (Ti) and respectively provided inner walls of the flange portion 215a corresponding to upper end and lower end of the anode 251, respectively.

The followings are the reason why the ion pump is provided. Generally, it is necessary to maintain the high vacuum condition in the vacuum chamber of the electron gun. In the conventional electron optics lens-barrel, an exhaust is performed by a general sputter ion pump mounted in the vacuum chamber to maintain the high vacuum condition. In the case of the field emission type electron gun, since it is necessary to keep the ultrahigh vacuum condition especially less than $10^{-9}$ Torr, one of the most important problems is how to exhaust in the vacuum chamber. Since an effective exhaust velocity of the general sputter ion pump decreases by a conductance and the like of a piping system, it is insufficient to accurately maintain the ultrahigh vacuum condition. The ion pump 250 according to the third embodiment comprises an anode and a cathode arranged around an electron gun in a vacuum vessel. Since such the construction can maintain the ultrahigh vacuum condition by directly exhausting circumstances of the electron gun, it is possible to utilize a high-speed effective exhaust and the miniaturization of the vacuum exhausting system. Since such the high-speed exhausting and miniaturized system coincide with the demand for improving the performance of the field emission type electron gun, the system having the ion pump and electron gun/optics lens-barrel as one body will increase its importance in the future.

An annular portion is formed to project from the flange portion 215a at the outer surface of the upper vacuum vessel 215, and a magnetic circuit 255 as magnetic field generating means is formed in the manner of covering the annular portion. The magnetic circuit as the magnetic field generating means comprises a magnetic substance 256 having a cylindrical shape for covering the entire peripheral surface of the upper vacuum vessel 215, a first permanent magnet 257 having a ring shape and fixed on an inner wall of the upper end of the magnetic substance 256, and a second permanent magnet 258 having a ring shape and fixed on an inner wall of the lower end of the magnetic substance 256. The electron gun 200B according to the third embodiment differs to other electric gun according to other embodiments at the several points as follows: An insulator 206 is configured in the longer size in comparison with the electron gun 200 according to tile first embodiment; Regarding this configuration, the magnetic field generating means 255 has a large scale configuration; And, the ion pump 250 is provided. Since other basic configuration are the same as the electron gun 200 according to the first embodiment, the duplicated description will be omitted.

Next, there will be described an operation of the electron gun according to the third embodiment. In this third embodiment, a magnetic source comprises two pieces of the permanent magnets 257 and 258 each having the ring shape and an axial symmetry. The permanent magnets 257 and 258 are arranged in parallel with the central axis direction of tile electron gun 200B, and both of the magnets 257 and 258 are magnetized in the same direction along the axial direction. A magnetic path is formed by the magnetic substance 256 between both magnets. FIG. 6B is a graph showing a magnetic field distribution on the central axis of the magnetic circuit 255 comprising two magnets 257 and 258 and the magnetic substance 256. In the graph, the maximum peak position of the magnetic field strength coincides with the position corresponding to the intermediate portion of two magnets 257 and 258, which is shown by "0" of distance graduations along the vertical axis. The figure shows the distribution in that the field strength decreases with receding in the distance from this position, a line of magnetic force inverts its direction, and the peaks appear again at the end of the ring shape magnets. Accordingly, one of the peaks of the magnetic distribution coincides with the portion where the aberration of the electrostatic lens system occurs, for example, the intermediate point between the leader electrode 203 and the lens electrode 204 shown in FIG. 6A.

In the electron gun according to the third embodiment, the gun is configured in the manner that one of the peak points coincides with the point between the leader electrode 203 and the lens electrode 204 where the aberration of the electrostatic lens system occurs. Namely, the gun is configured in the manner that the intermediate point between both electrodes 203 and 204 coincides with anyone of two peak values ($-150$ Gs) near $\pm 50$ mm distant from 0 in FIG. 6B.

In the third embodiment shown in FIG. 5, it is also possible to change the relative position between the electrostatic lens system and the magnetic circuit 255 by the moving mechanism 221.

The electron gun according to the third embodiment is configured in the manner that one of the peak values of the magnetic field coincides with between the leader electrode 203 and lens electrode 204 where the aberration of the electrostatic lens system occurs. Namely, in FIGS. 6A and 6B, the intermediate point of both the electrodes 203 and 204 coincides with anyone of the maximum peak point (300 Gs) and two other peaks ($-150$ Gs) which are respectively positioned near $\pm 50$ mm distant from the maximum peak.

FIG. 7 is a graph showing changes of the spherical aberration coefficient $C_{SO}$ and the chromatic aberration coefficient $C_{CO}$ when the relative position of the electro-static lens system and the magnetic circuit 255 changes. The axis of abscissa of this graph shows a distance from the intermediate position between the permanent magnets 257 and 258 to the cathode, and the axis shows the calculation results of the spherical aberration coefficient $C_{SO}$ and the chromatic aberration coefficient $C_{CO}$ on the objective side when a crossover position is fixed to a position 40 [mm] distant from the cathode. The minimum position of each aberration does not reside in the place where the peak position (the intermediate position of two pieces of the magnets) of the magnetic field corresponds to the cathode position, and resides in the place where the peak position corresponds to the intermediate portion between the leader electrode and the lens electrode of the electrostatic lens system. The aberration of the electrostatic lens system mainly occurs between the leader electrode and the lens electrode and coincides with peak position of the maximum value of the magnetic field where the aberration coefficient becomes lowest value under the condition that the crossover position is 40 [mm] distant from the cathode, an acceleration voltage is 1.0 [kV], and a voltage of the leader electrode 4.0 [kV].

In the construction of the magnetic circuit 255 of the third embodiment, the peak of the magnetic distribution along the central axis corresponds to the intermediate position between two pieces of the ring-shaped permanent magnet. Since the outer surface of the magnetic circuit is enclosed by the magnetic substance at this position, the field distribution in the radial direction inclines toward the central axis, thereby resulting an improvement of the magnetic strength of the distribution on the axis. Therefore, the electron gun of the third embodiment can be obtain higher magnetic distribution on the axis in comparison with the magnetic circuit comprising the a piece of the ring shape magnet and magnetic substance according to the first embodiment of the present invention shown in FIG. 2.

Figure 8:
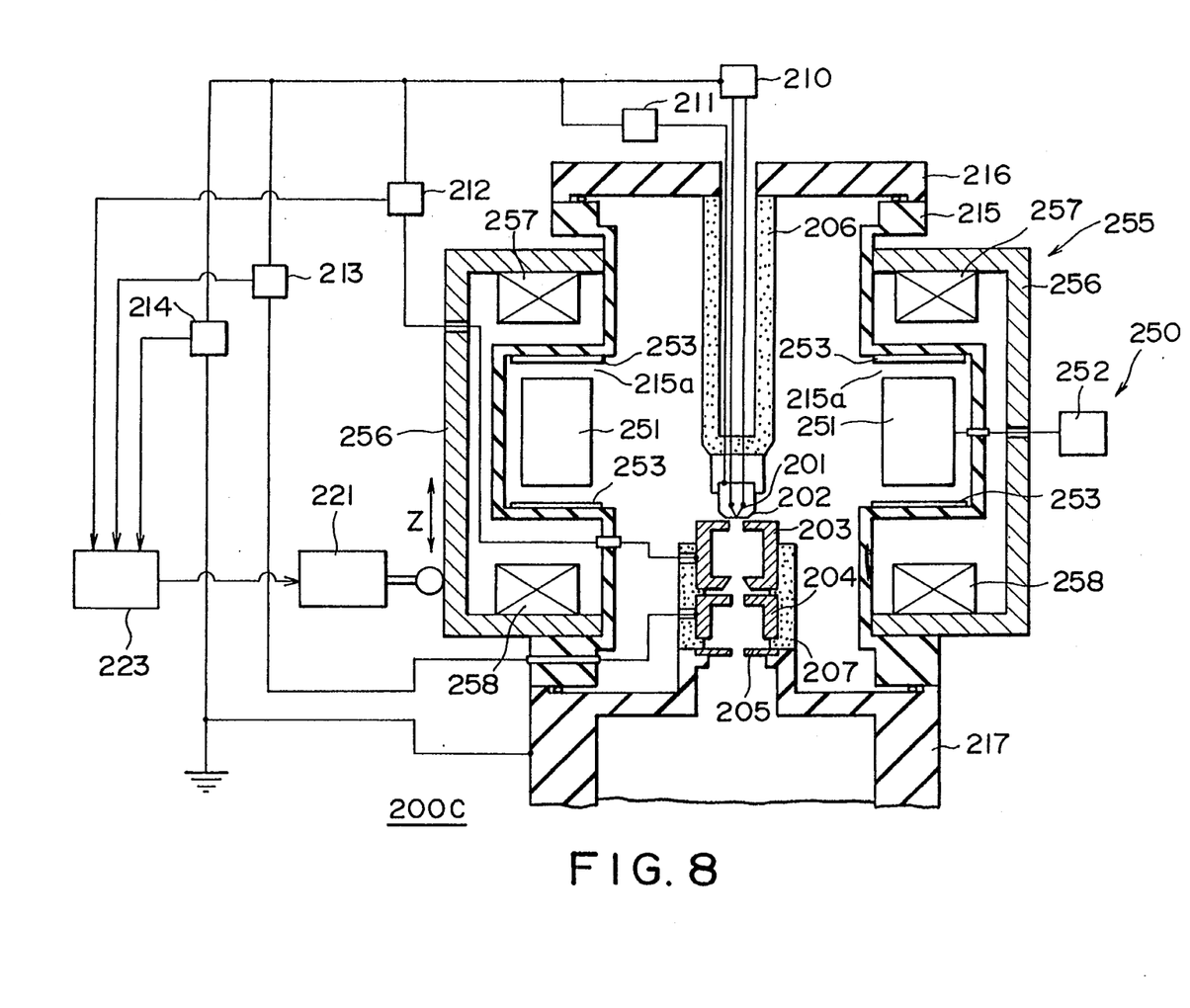
FIG. 8 is a sectional view showing a schematic configuration of a magnetic immersion field emission electron gun according to a fourth embodiment of the present invention.

Next, there will be described a magnetic immersion field emission electron gun 200C according to a fourth embodiment of the present invention with reference to FIG. 8. The electron gun 200C according to the fourth embodiment has substantially the same configuration of the electron gun 200B according to the third embodiment, and has two different points that one is a provision of the automatic position detection control mechanism 223 having the same configuration as the electron gun 200A according to the second embodiment, and another is a displacement from the permanent magnet 258 to an electromagnet 259 in the magnetic circuit 255 as the magnetic field generating means.

The automatic position detection control mechanism 223 as the first different point controls a drive of the moving mechanism 221 for regulating the movement of the magnetic substance 256 of the magnetic circuit 255 in the Z-direction on the basis of respective set value of the power sources 212, 213 and 214, and has the same configuration and operation as the electron gun according to the second embodiment.

Furthermore, since the permanent magnet 258 is displaced by the electromagnet 259 in the fourth embodiment to interpose the composite magnetic field of the permanent magnet 257 and the electromagnet 259 to the electrostatic lens system, it is possible to obtain the same effect as the third embodiment. In this construction, it is possible to achieve the miniaturization and simplification of the entire electron gun by using the permanent magnet. In addition, the high magnetic field can superpose to the electrostatic lens system. Furthermore, since the magnetic field strength of the electromagnet is changed by the variable current source 222, the field distribution can change to superpose over the electrostatic lens system, and the electron gun has an advantage that it is possible to simply set the maximum value of the field distribution to an arbitrary portion where the aberration occurs.

There will now be described a magnetic immersion field emission electron gun 200D according to a fifth embodiment of the present invention with reference to FIGS. 9–10B. The electron gun 200D of the fifth embodiment has two points different from the first through the fourth embodiments. A first different point resides in that the magnetic circuit 300 as the magnetic field generating means is different from the former embodiments. A second different point resides in that the intermediate portion between the leader electrode 203 and the lens electrode 204 coincides with the substantial intermediate point in the longitudinal direction of the magnetic substance 303 constructing the magnetic circuit 300. Even though an outline of the magnetic field generating means is longitudinal cylindrical tank shape as the same as the third and fourth embodiments, since the ion pump 250 is not provided, it is possible to provide the electrostatic lens system at the portion corresponding to the maximum peak of the magnet field strength.

Figure 9:
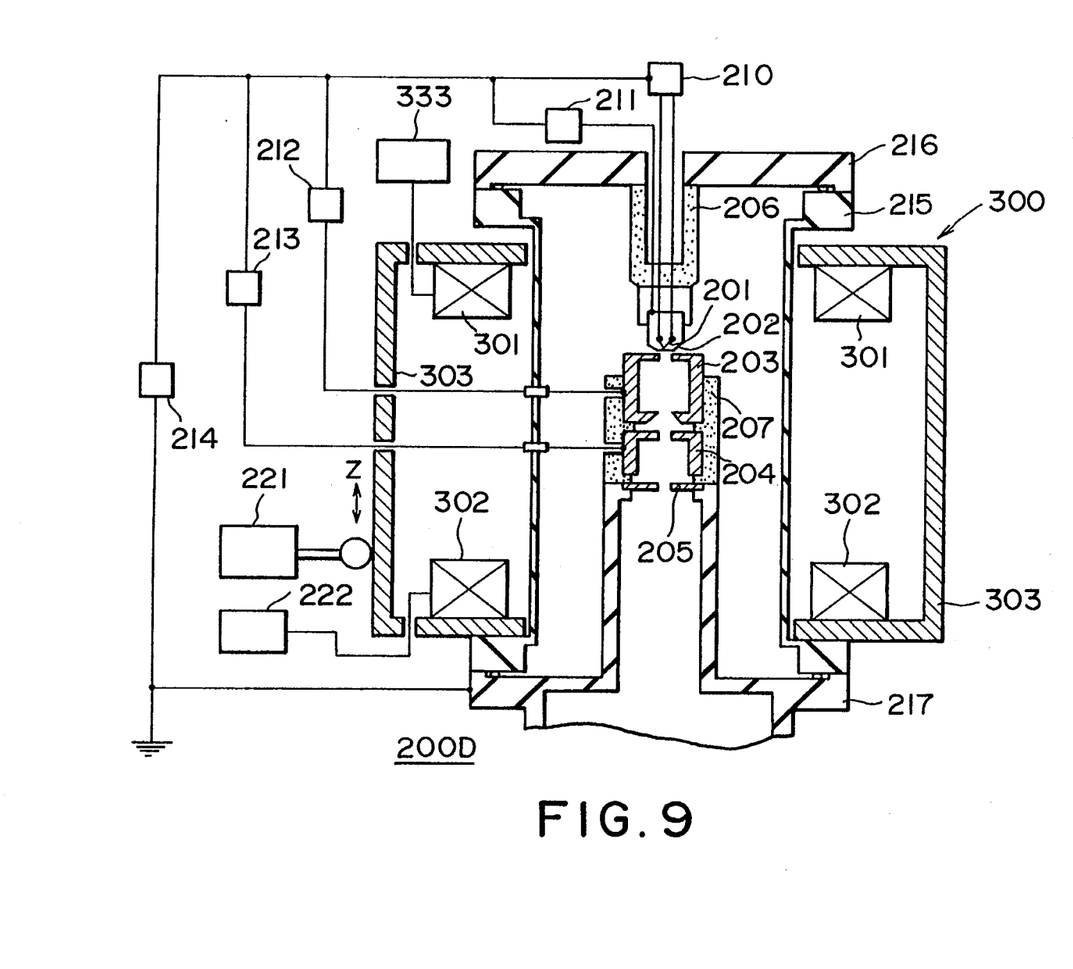
FIG. 9 is a sectional view showing a schematic configuration of a magnetic immersion field emission electron gun according to a fifth embodiment of the present invention.

In FIG. 9, the central portion of the lower vacuum vessel 217 upwardly rises on the figure in the manner being as a pedestal of the electrostatic lens system. An insulator 207 is set on the pedestal, and the leader electrode 203, lens electrode 204 and anode 205 are attached with the insulator 207 in the same manner as the electron gun according to the first through the fourth embodiments.

The magnetic circuit 300 comprises an electromagnet 301 of the upper end, an electromagnet 302 of the lower end, and a magnetic substance 303 to which the electromagnets 301 and 302 are mounted on the inner walls of the upper end and lower end thereof, respectively. The electromagnet 302 is connected to the variable current source 222 as the same manner as the fourth embodiment, and the electromagnet 301 is also connected to a variable current source 333.

Figure 10A:
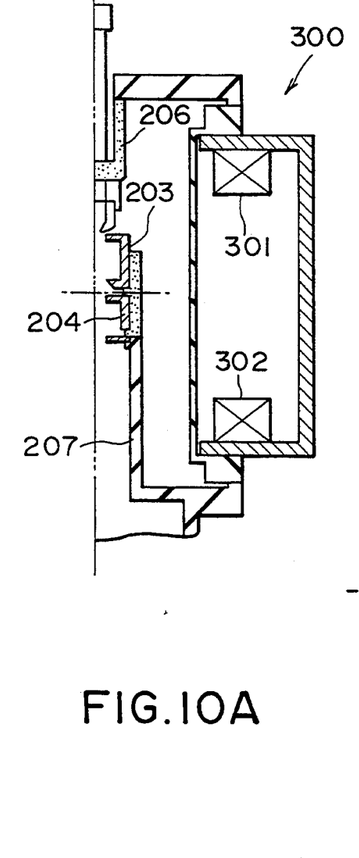
FIGS. 10A and 10B are a partially sectional view showing the electrostatic lens system, and a graph showing a magnetic field distribution on the central axis of the electrostatic lens system, respectively, with respective to the electron gun according to the fifth embodiment shown in FIG. 9.
Figure 10B:
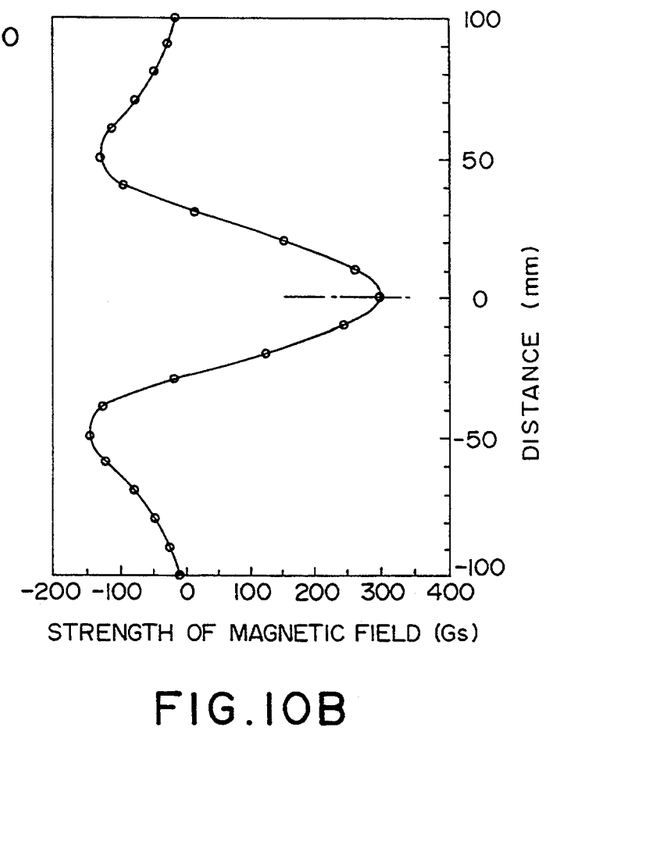

By the electron gun 200D having the above configuration, as shown in FIG. 10B, it is possible to realize that the maximum peak portion of the magnetic field in three peak points where the magnetic circuit 300 occurs coincides with the intermediate portion of the leader electrode 203 and the lens electrode 204 shown in FIG. 10A where the aberration of the electrostatic lens system becomes most conspicuous in comparatively easy course.

In the above fifth embodiment, even though the electromagnets 301 and 302 are used as the magnetic source, these electromagnet may be displaced by the two pieces ring shaped permanent magnets.

Figure 11:
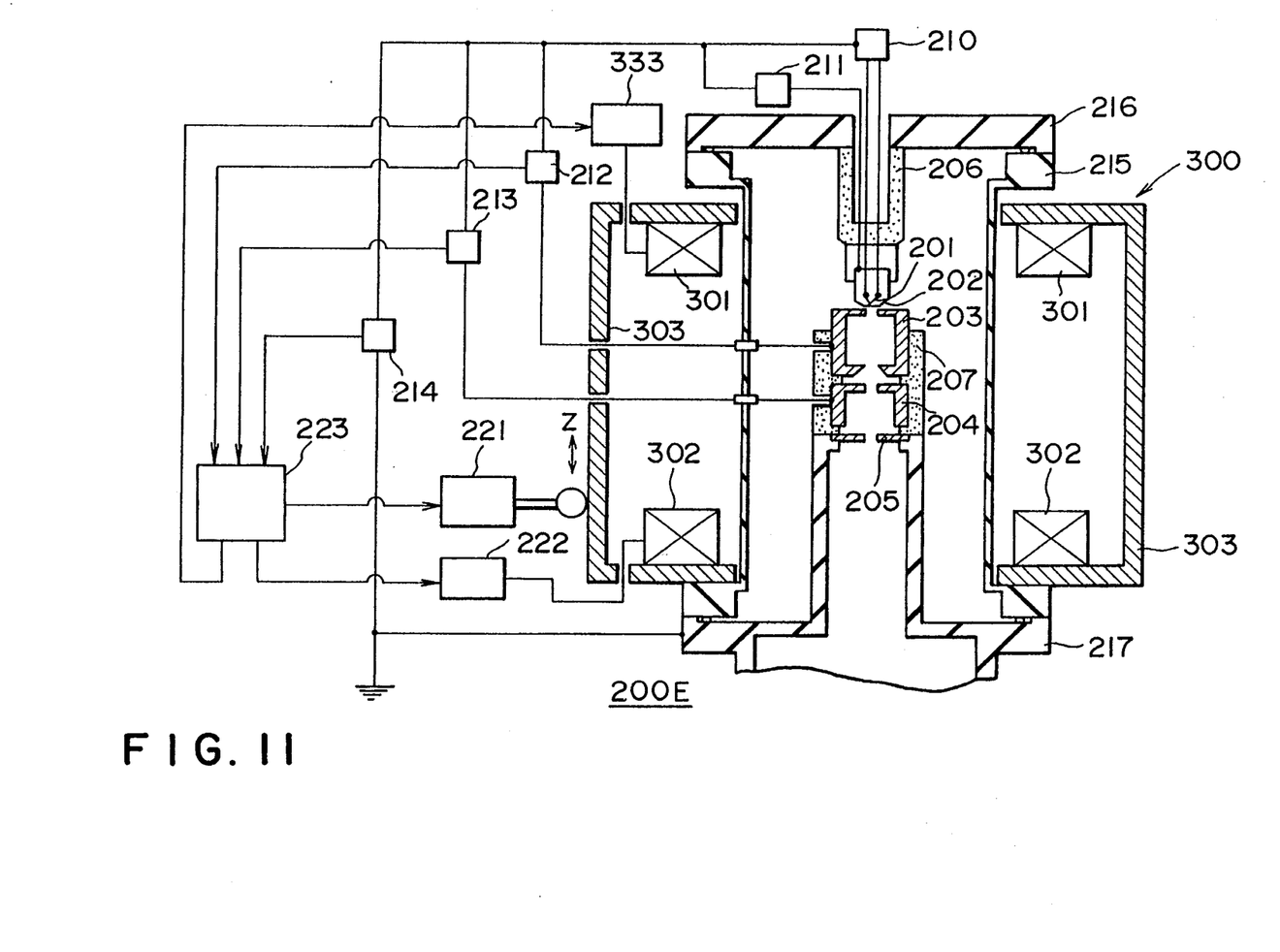
FIG. 11 is a sectional view showing a schematic configuration of a magnetic immersion field emission electron gun according to a sixth embodiment of the present invention.

Lastly, there is described a magnetic immersion field emission electron gun 200E according to a sixth embodiment of the present invention with reference to FIG. 11. The electron gun 200E of the sixth embodiment is the best mode of the present invention. The electron gun 200E according to the sixth embodiment basically has the same configuration as the electron gun 200D according to the fifth embodiment. The different point from the fifth embodiment resides in that the gun 200E has an automatic position detection control mechanism 223 for automatically controlling the moving mechanism 221 which causes the magnetic substance 303 of the magnetic circuit 300 as the magnetic field generating means to be moved in the Z-direction to the desired position. The automatic position detection control mechanism 223 outputs a drive control command to the moving mechanism 221 on the basis of the respective set value of the power sources 212, 213 and 214 in the same manner as that of the second through fourth embodiments. The moving mechanism 221 causes the magnetic circuit 300 by rotating such as the motor with the predetermined amount on the basis of the drive control command. By this, it is possible to automatically coincide the most conspicuous portion of the aberration of the electrostatic lens system with the peak point of the magnetic field strength.

In the sixth embodiment different from the fifth embodiment, current changes of the variable current sources 222 and SS3 are controlled by a control signal supplied from the automatic position detection control mechanism 223. By such the configuration, it is possible to change the magnetic distribution superposing over the electrostatic lens system, thereby enabling the parallel control with respect to the positional regulation of the magnetic field peak point and the movement of the magnetic circuit in the Z-direction.

What is claimed:

1. A magnetic immersion field emission electron gun capable of reducing an aberration occurring in an electrostatic lens system, comprising a vacuum vessel having a central axis in a predetermined direction;

a cathode arranged on the central axis of said vacuum vessel for generating an electron beam;

an anode for forming an electron beam path by accelerating said electron beam generated by said cathode toward said central axis;

an electrostatic lens arranged between said cathode and anode for generating an electric field focusing said electron beam accelerated by said anode on said central axis;

magnetic field generating means arranged around said electron beam for path generating a magnetic field which causes said electron beam to be reduced in order to prevent a diameter of the electron beam from an expansion caused by an aberration of said electrostatic lens system; and moving means for causing said magnetic field generating means to be moved to a position where a peak value of a strength of the magnetic field generated by said magnetic field generating means coincides with a portion where an aberration of the electrostatic lens becomes most conspicuous.

2. The electron gun according to claim 1, further comprising automatic position detection control means for automatically controlling a drive of said moving means by calculating a position where an aberration of said electrostatic lens becomes the maximum value on the basis of set values of a plurality of power sources with respect to said vacuum vessel and said electrostatic lens.

3. The electron gun according to claim 1, wherein said electrostatic lens comprises a leader electrode arranged near said cathode for leading said electron beam, and a lens electrode arranged at a position adjacent to said leader electrode for focusing said electron beam.

4. The electron gun according to claim 1, wherein said magnetic field generating means comprises a plurality of magnets arranged at a predetermined interval along said electron beam path direction.

5. The electron gun according to claim 1, wherein said magnetic field generating means uses anyone and/or both of an electromagnet and permanent magnet.

6. The electron gun according to claim 1, wherein said magnetic field generating means has a magnetic path in which a magnetic substance connects a plurality of magnets.

7. The electron gun according to claim 6, wherein one of peaks of the magnetic field strength which is generated by said magnetic field generating means exists in a position including an intermediate point of said plurality of magnets.

8. The electron gun according to claim 7, wherein exhaust means for maintaining a vacuum condition in a vacuum vessel is provided at said intermediate point of said plurality of magnets.

9. The electron gun according to claim 8, wherein said exhaust means is comprised of an ion pump at least having an anode which is provided at said intermediate point, and a plurality of cathodes each provided at a portion opposite to each of both ends of said anode.

10. The electron gun according to claim 1, wherein said electrostatic lens comprises a suppressor electrode arranged in the manner of covering the entire cathode in order to suppress an emission of said electron beam from said cathode to unnecessary direction, a leader electrode including a cylindrical shape having a central axis coinciding with said central axis of the cathode, and a lens electrode having a cylindrical shape arranged with a predetermined distance to said leader electrode in the manner of having a central axis coinciding with said central axis of said leader electrode and for determining a crossover position as a focal point of the electron gun;

said magnetic field generating means comprises a magnetic substance having a drum shape in which said vacuum vessel is inserted in coaxial at a center and arranged at a peripheral side of said vacuum vessel in the manner that a gap between said leader electrode and said lens electrode comprising said electrostatic lens positions to a substantially center portion of said drum shape in the axial direction, and a magnet arranged in a ring shape on an inner wall of an end portion of said drum of said magnetic substance; and said moving means is comprised of a drive mechanism which causes said magnetic substance having said drum shape and comprising said magnetic field generating means to be moved in the axial direction in the manner that a peak point of the magnetic field generated by said magnetic field generating means coincides with said gap between said leader electrode and lens electrode in said electrostatic lens.

11. The electron gun according to claim 10, wherein said magnetic field generating means has a magnetic path in which a magnetic substance connects a plurality of magnets.

12. The electron gun according to claim 11, wherein one of peaks of the magnetic field strength which is generated by said magnetic field generating means exists in a position including an intermediate point of said plurality of magnets.

13. The electron gun according to claim 12, wherein exhaust means for maintaining a vacuum condition in a vacuum vessel is provided at said intermediate point of said plurality of magnets.

14. The electron gun according to claim 13, wherein said exhaust means is comprised of an ion pump at least having an anode which is provided at said intermediate point, and a plurality of cathodes each provided at a portion opposite to each of both ends of said anode.

* * * * *